United States Patent [19]
Karasawa

[11] Patent Number: 5,374,888
[45] Date of Patent: Dec. 20, 1994

[54] ELECTRICAL CHARACTERISTICS MEASUREMENT METHOD AND MEASUREMENT APPARATUS THEREFOR

[75] Inventor: Wataru Karasawa, Yokohama, Japan

[73] Assignee: Tokyo Electron Kabushiki Kaisha, Japan

[21] Appl. No.: 937,790

[22] Filed: Sep. 2, 1992

[30] Foreign Application Priority Data

Sep. 5, 1991 [JP] Japan .................. 3-254637

[51] Int. Cl.⁵ .................................... G01R 1/04
[52] U.S. Cl. .................... 324/765; 324/754; 437/207
[58] Field of Search ............ 324/158 F, 158 P, 158 R; 437/207

[56] References Cited

U.S. PATENT DOCUMENTS 4,295,776 10/1981 Payne et al. .................. 414/405
4,571,542 2/1986 Arai .................. 324/158 F
4,654,955 4/1987 Mathie .................. 414/736

Primary Examiner—Kenneth A. Wieder
Assistant Examiner—Barry C. Bowser
Attorney, Agent, or Firm—Beveridge, DeGrandi, Weilacher & Young

[57] ABSTRACT

A method for positioning and testing an object to be tested wherein the surface of an object to be tested for electrical characteristics is brought into contact with a test probe. The side of the object opposite the surface to be tested is held by a suction device on the end of one of many arms which are attached to a rotating shaft. The object is then transported to a position to bring it into contact with the test probe where testing is performed to determine whether or not the object is faulty. If necessary, the arms are manipulated in an up and down and an in and out direction with respect to the shaft, and the suction device rotated, to maintain the object to be tested in a proper orientation.

5 Claims, 5 Drawing Sheets

ELECTRICAL CHARACTERISTICS MEASUREMENT METHOD AND MEASUREMENT APPARATUS THEREFOR

BACKGROUND OF THE INVENTION

The present invention relates to a method for the measurement of the electrical characteristics of an object and a measurement apparatus utilizing the method.

In general, a known probe apparatus is an apparatus which uses a probe wire on a probe card to contact a bonding pad or the like provided to an object to be measured, and measures the electrical characteristics of semiconductor devices such as a semiconductor wafers.

FIG. 12 shows such a conventional type of probe apparatus, which has a structure including a holding means 4 which is freely movable in the X, Y and Z directions and has a wafer 2 loaded thereon, a probe apparatus 10 which has a probe card having a probe 6 in contact with a bonding pad of the wafer 2, and which is arranged above a holding means 4, and a test pad 14 which is hinged so as to be able to rise above the probe card 8 and be positioned to the side and above the probe apparatus 10. Test pad 14 is connected by wires 17 to a tester (not shown). In addition, instead of the hinge 12, a manipulator arranged to one side of the probe apparatus 10 can be used to support the test head 14 so that it can be raised and lowered (as for example, disclosed in Japanese Patent Publication (KOKOKU) No. 43854-1986, Japanese Utility Model Publication (KOKOKU) No. 4031-1991).

Testing the electrical characteristics of a wafer 2 by the conventional probe apparatus having the structure described above, is performed by first moving the test head 14 to the side above the probe card 8 so that the contact 16 mounted to the test head 14 comes into contact with the entrance/exit pin 18 of the probe card 8. Then, the probe 6 of the probe card 8 is brought into contact with the bonding pad 2a of the wafer 2 which has had its position adjusted by an alignment apparatus (not shown), and the tester (not shown) and which is connected to the test pad 16, measures the electrical characteristics of the wafer 2.

In a processing apparatus such as a supercomputer or the like, for which high speed is particularly important, it is necessary to shorten the internal wiring as much as possible to increase the processing speed. Instead of using a chip which resides within a package or the like, a semiconductor wafer is directly connected to an unpackaged cut chip using a connection method which not only increases the processing speed but also improves the mounting density. In this situation, an apparatus such as that shown in FIG. 12 is used to check the functions of each mounted chip by testing at the wafer level prior to cutting. However, it is known that heat, vibration and other damage sustained when there is cutting causes a decrease of about 0.1% in the yield. Sometimes an unpackaged chip which has proven reliable at the wafer level by testing prior to cutting, but after such a chip is mounted to a substrate is later judged to be faulty. There is the problem that the entire substrate has to be discarded since many unpackaged chips have already been mounted.

In addition, when the probe apparatus shown in FIG. 12 is used for testing at the wafer level, the operation is extremely complex since positioning of the cumbersome test head is different for testing a wafer, testing of characteristics of a chip, and testing of a packaged device.

Furthermore, when characteristics testing is performed at low temperatures (of −10° C. to −55° C.) at the wafer level, a plural number of Peltier elements are used to cool the entire wafer. However, when all of the chips on a single wafer are being measured, other chips which have no role in the measurement, have to be cooled, thus there is a problem of poor efficiency, multiple failures of the Peltier elements, and low reliability.

SUMMARY OF THE INVENTION

The present invention proposes an effective means of and method for solving these problems. An object of the present invention is the provision of a probe apparatus and a method for its use which can efficiently measure the electrical characteristics of a chip which has been cut or packaged.

In order to solve this problem, the present invention was a probe apparatus which contacts a probe wire or wires on a probe card or the like to a bonding pad or an object for testing, and measures the electrical characteristics of that object. The object is provided with a holding means which holds a packaged chip or integrated circuit chip which has been cut from a semiconductor wafer, and brings the probe wire into contact with it.

Configured as described above, the holding means of the present invention holds a package or one chip which has been cut from a semiconductor wafer and brings the bonding pad or the like into contact with the probe of the probe card. Then, the detected electrical signals are input to a tester via the probe card and the test pad and the electrical characteristics are measured.

DESCRIPTION OF THE PREFERRED EMBODIMENTS

The following is a detailed description of preferred embodiments of the present invention, with reference to FIG. 1 through FIG. 7.

Figure 1:
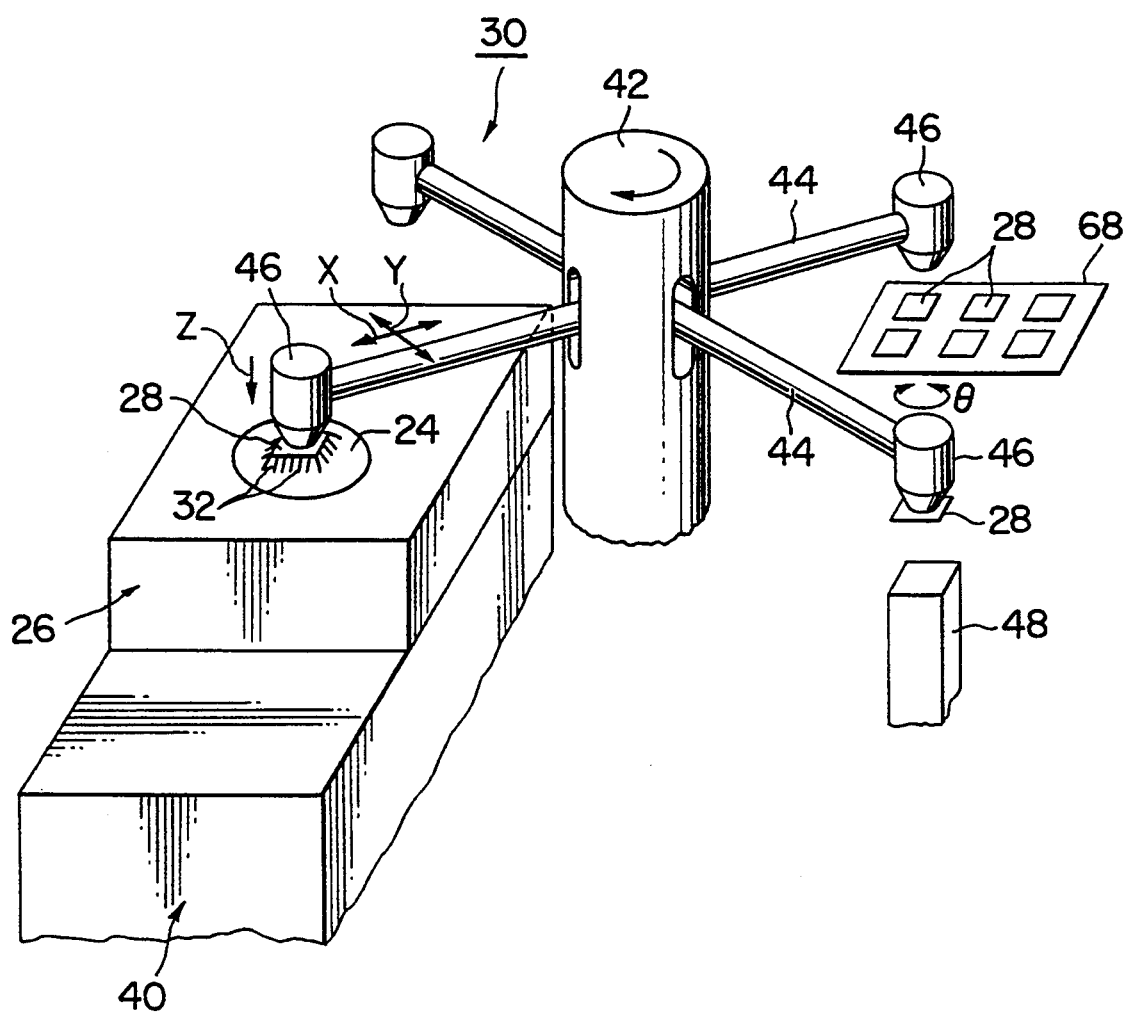
FIG. 1 is an outline perspective view of one embodiment of the probe apparatus of the present invention.
Figure 2:
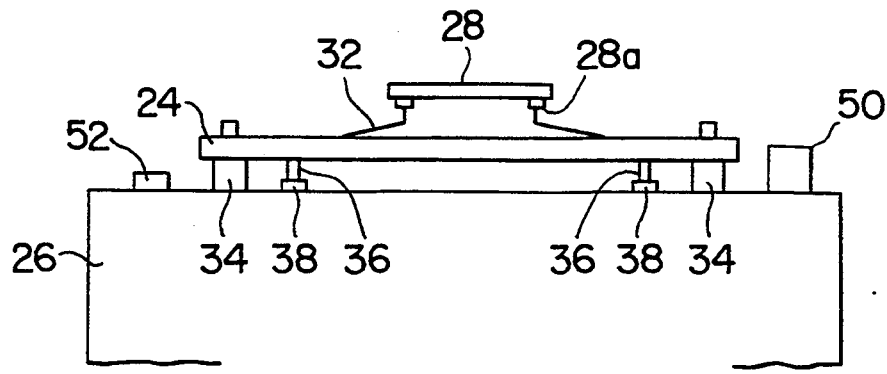
FIG. 2 is a front view showing the status where a probe card facing upwards is mounted to the test head.
Figure 3:
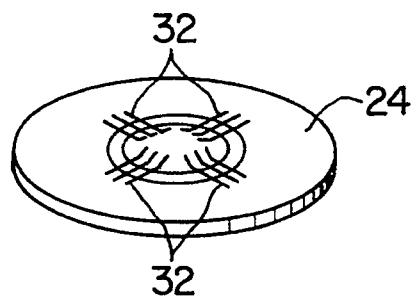
FIG. 3 is a perspective view of a probe card.

FIG. 1 is an outline perspective view of one embodiment of the probe apparatus of the present invention, FIG. 2 is a front view showing the status where an upward facing probe card is mounted to a test head, and FIG. 3 is a perspective view of a probe card.

As shown in FIG. 1 and FIG. 1, the main elements of the configuration of this probe apparatus are a probe card 24 (which is stored in a stacker and can be exchanged in accordance with the size and type of chip to be tested, a test head 26 which is connected to and supports the probe card 24 which communicated electrical signals, and a conveying means (robot) 30 which secures and conveys an object, such as a single chip cut from a wafer, which is the object for testing.

The center of the probe card 24 is provided with a plurality of probes which contact with a bonding pad 28a (which is 60 am square for example) of a chip 28. These probes are provided an upward curtain inclination on the probe card 24. The probe card 24 includes a condenser for precision adjustment and a relay for switching the electrical connection between the test head 26 and the probe 32 in accordance with the type of chip 28 which the object of testing. The probe card 24 is fixed by a fixing means such as a screw of the like, to the test head 26 via a support column 34.

The probe card 24 is provided with many "pogo-pins" 36 which flexibly protrude via an elastic internal member (not shown). These pogo-pins come into contact with a contact 38 provided on the test head 26 so that an electrical connection is made between the probe 32 and the test head 26. This test head 26 includes a detection power source which provides power to the object for detection, a bonding pad, various types of electrical equipment such as an input means for relaying the output of the bonding pad, and a pattern output portion to the measurement portion.

This test head 26 is directly mounted on a tester 40, and the two are connected by a cable which is kept as short as possible.

In this first embodiment, the conveying means 30 has a cylindrical shaped rotatable shaft 42 and at its periphery at 90° intervals are four arms 44 arranged in a radial shape. At distal end portions of each of these arms 44 are provided suction heads 46 for suction holding of a chip 28 by vacuum force these suction heads 46 are provided so as to be rotatable. The rotation of the rotating shaft 42 rotationally moves the suction heads 46 through an angle which maintains proper orientation of the chip or object relative to the probe card 24.

A gear mechanism (not shown) rotates the suction heads 46 through a suitable angle while maintaining the object in a horizontal plane. In processing prior to measurement, the position direction of the chip 28 is confirmed by a CCD camera for example and a rotational correction is performed for that position.

In addition, the arms 44 can move a suitable distance in the X direction, that is, the direction of the length of the arms, in the Y direction which is the direction intersecting the X direction parallel to the surface of the probe card 24, and in the direction of the axis of the rotating shaft 4, that is, the Z direction.

Then, on the test head 26 is provided an X-Y position detection camera 50 for performing the detection of the position in the X and Y directions of the chip 28 which is held by the suction heads 46, and an electrostatic capacitance sensor 52 is also provided for detecting the position of the chip 28 in the Z direction.

The following is a description of the operation of the probe apparatus of a first embodiment of the present invention, and having the configuration described above.

In this first embodiment, after many chips (objects for testing) have been formed on a single semiconductor wafer and cut, measurement of the electrical characteristics is performed one chip at a time.

Figure 4:
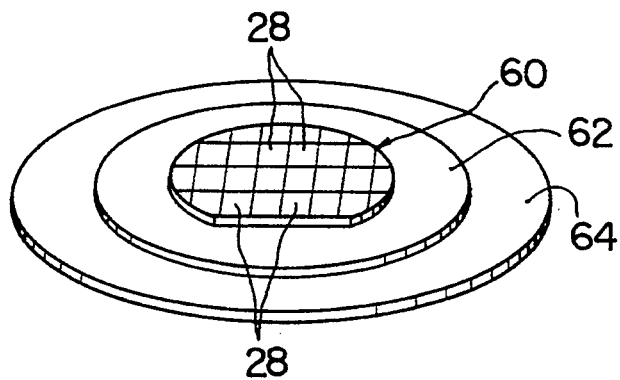
FIG. 4 is a view showing the status where a semiconductor wafer is mounted to an adhesive sheet and a metal frame, and where the semiconductor wafer is cut for each chip.

Because of this, as shown in FIG. 4, a semiconductor wafer 60 on which many chips have been formed is attached to an adhesive wafer sheet 62 and this wafer sheet 62 is mounted on a wafer frame 64. The semiconductor wafer 60 is taken into a dicing saw and each of the chips 28 are cut from the semiconductor wafer 60. When this is done, the dicing saw cuts to a depth equal to approximately 90% of the thickness of the semiconductor wafer 60 and the entire chip is then pulled off of the semiconductor wafer 60 by suction force.

Figure 5:
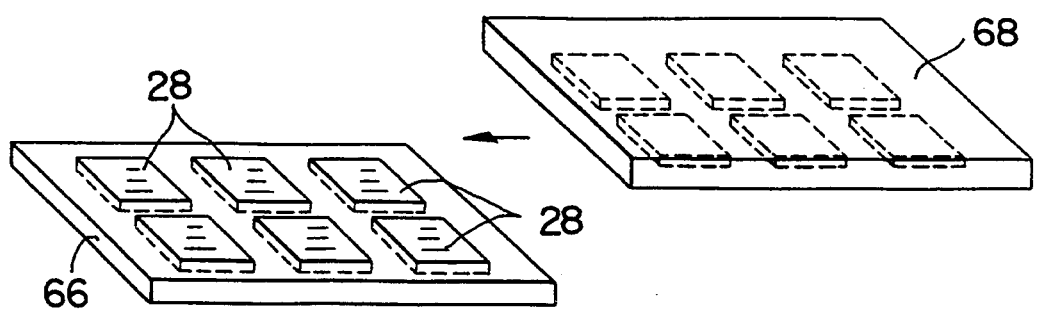
FIG. 5 is a perspective view showing the status where each cut chip has been mounted on a bottom case.
Figure 6:
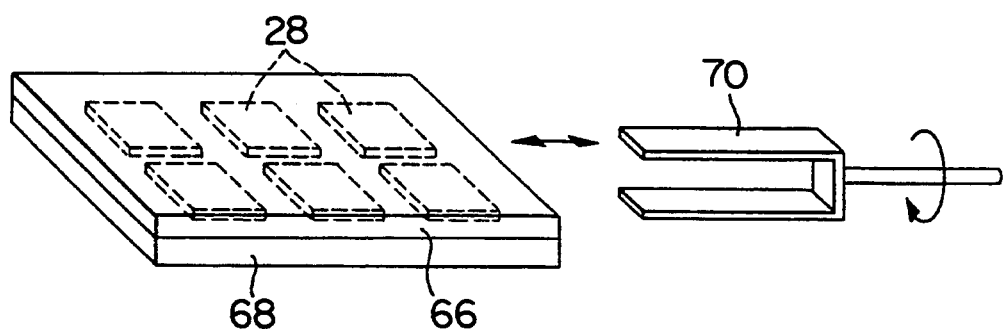
FIG. 6 is a perspective view describing the method of inversion of a cut chip mounted on the lower side chip case.

When the cutting of each chip 28 is finished then as shown in FIG. 5, a pick-up apparatus (not shown) is used to pick-up each chip 28 and arrange and house it in a storage groove of a rectangularly shaped bottom case (a storage case) 66. The storage groove houses a plural number of chips 28 in the status where the pattern surface (the surface to be tested) faces upwards. After this, a separate drive means places a top case 68 having the same number of storage grooves, on top of the bottom case 66. As shown in FIG. 6, a holding arm 70 driven by a separate drive means takes both of the chip cases and turns them over 180° so as to overturn the cases.

Figure 7:
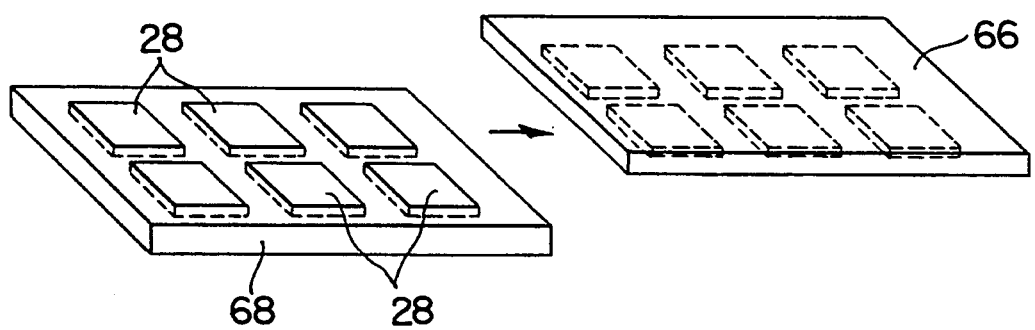
FIG. 7 is a perspective view of each chip mounted on an inverted top case.

When this has been done and the two cases are reserved as shown in FIG. 7. The bottom case 66, now positioned above the top case 68, is taken off, and as shown in FIG. 1, the top case 68 is then made accessible to the probe apparatus. The status of the objects to be tested is such that the surface of the chips 28 to be tested inside the upper case 68 now faces downwards.

In this embodiment, the four arms 44 perform the same operation in succession. The following is a description of the operation of one arm, with reference to FIG. 1.

First, the arm 44 of the probe apparatus is positioned so as to correspond with the top case 68 in which the chips 28 are stored. Then the suction heads 46 mounted to the distal ends of the arms are used to hold one of the chips from the rear.

The rotating shaft 42 of this holding means 30 rotates through 90° when one chip 28 is being held in this manner, and positions the chip immediately above a CCD camera 48 which observes the chip while the suction pad itself is rotated to perform pre-alignment of the chip 28 in the θ direction.

The rotating shaft 42 then rotates the arms 44 through a further 90° and the chip 28 which has already been pre-aligned in the θ direction is positioned above the probe card 24. Then, as shown in FIG. 2, the X-Y position detection camera 50 detects the position of the chip 28 while movement of the arm 44 in the X and Y direction adjusts the X-Y position of the chip 28 so that alignment is made such that each of the bonding pads 28a of the chip 28 and each of the probes 32 will be in contact.

Then, either at the same time as or once the alignment of the X-Y position of the chip 28 is completed, the electrostatic capacitance sensor 52 is used to determine the position in the Z direction, and the arm 44 is lowered to a suitable position. Then, the bonding pad 28a of the chip 28 and the probes 32 of the probe card 24 are brought into contact and the tester 40 is used to measure the electrical characteristics of the chip 28.

The time required for the bonding pad 28a and the probe 32 to be brought into contact, and for the measurement of the electrical characteristics to be performed for determination as to whether or not the chip 28 is faulty requires a maximum of 60 seconds for a high-speed, high-density mounted IC.

After the measurement of the electrical characteristics of a chip 28 has been performed, the arm 44 is rotated a further 90°, and the faulty chips and the non-faulty chips are separated from each other. A separated lead frame conveyor mechanism is provided for when there is to be direct bonding to a lead frame or a non-faulty chip case.

According to the present embodiment, this series of operations is performed automatically while rotating the four arms 44 of the probe apparatus about the shaft 42 and it is possible for measurement and detection of each of the chips 28 to be performed efficiently after cutting.

While the maximum time that is required for the detection process which performs the actual measurement of the electrical characteristics of the chip 28 is 60 seconds, there is also the standby time required for other processes such as the chip holding process and the chip $\theta$ position prealignment process.

In addition, in the present structure the probe card 24 is facing upwards in an arrangement different from that of a conventional apparatus (see FIG. 12), and it is not necessary for the test head 26, which can weigh as much as 800 kg and houses the various kinds of electronic circuits, to be rotated on its hinge for each new chip to be tested. Also, the test head 26 and the tester 40 can have a unified structure, and it is thus possible to greatly reduce the cable length between them. In particular, when testing of chips and the like for supercomputers which require high speed testing at a testing frequency of 500 MHz for example, it is possible to minimize the time delay caused by the cable length.

In addition, by having either a single structure or by mounting the test head 26 and the tester 40 to each other, there are no cables lying across the floor, and hence damaged cables or faulty contacts and other problems caused by this are eliminated.

In the case such as the present embodiment where measurement is performed in the status where the pattern surface of the chip is facing downwards, there is no adhesion of fine particles of dust or portions of oxidation films falling onto the chip surface due to the probe in the course of actual measurement, thus it is possible to prevent deterioration of the chip quality.

Furthermore, if a packaged chip as is held by suction, it is possible to efficiently measure whether the packaged chip is faulty or not, thus it is possible to use a single tester for both unpackaged chips and for packaged chips, thereby proving extremely efficient.

Moreover, in the embodiment described above, the four arms 44 are each separately controlled but if the distance between the suction head 46 and the probe card 24, the distance between the CCD camera 48 and the suction head 46 is set so that the amount which each of the arms 44 is to move in the Z direction are the same, then all of the arms can be moved in the Z direction by adjusting the rotating shaft 42 in the Z direction and avoiding having to move each of the arms 44 in the Z direction to enable the chip 28 to be held and for there to be contact with the probe 32.

If the X-Y position of the arm 44 is stored beforehand in a memory, then there need only be $\theta$ direction pre-alignment in the later processes, or the chip can be held while X-Y direction pre-alignment of the chip case 68 is performed.

In addition, there can be less than four arms 44. For example, one arm can be provided in an extremely simple configuration. Also, the test head 26 and the tester 40 can be connected by a thick cable.

Also, the probe card 24 of this embodiment can function as a performance board and can handle high-speed measurement but it is of course possible that a performance board be applied to an separately formed apparatus as in the case of a conventional apparatus.

Figure 12:
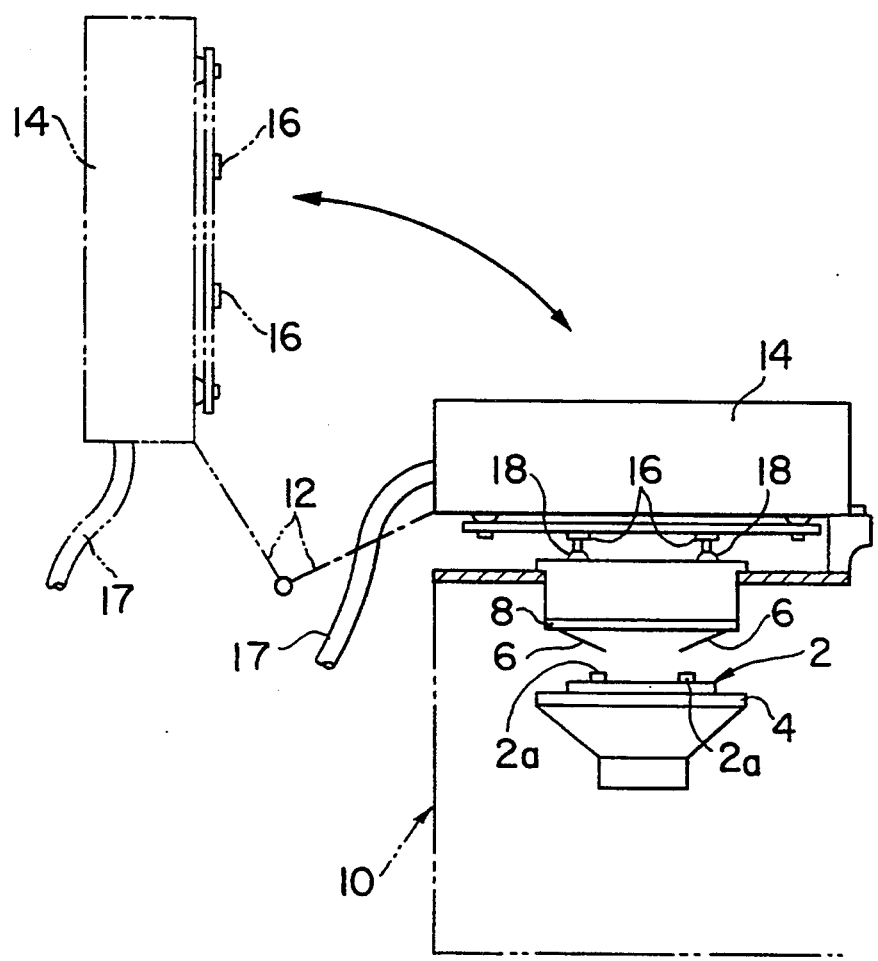
FIG. 12 is an outline longitudinal sectional view of a conventional probe apparatus.

Furthermore, in the embodiment described above, measurement of the chip 28 was performed when the probe card 24 faced upwards but the direction which the probe card 24 faces is not limited, and can be an arbitrary direction, such as an inclination with respect to the horizontal, or vertically downwards such as shown in FIG. 12 for a conventional apparatus. For example, when the probe card 24 is inclined downwards, a rotating shaft 42 is provided so as to perpendicularly intersect with the inclined surface of the probe card, and the rotating surface of the arm 44 is set so as to be parallel to the inclined surface of the probe card. In addition, when the present embodiment is applied to an apparatus which has the probe card set to be facing downwards as shown in FIG. 12, the rotating shaft 42 and the arm 44 are set as shown in FIG. 1, where they are opposite each other up and down.

Also, the embodiment which has already been described can be entirely inverted and thus be set to perform testing of chips with a probe card 24 arranged to be facing down.

Figure 8:
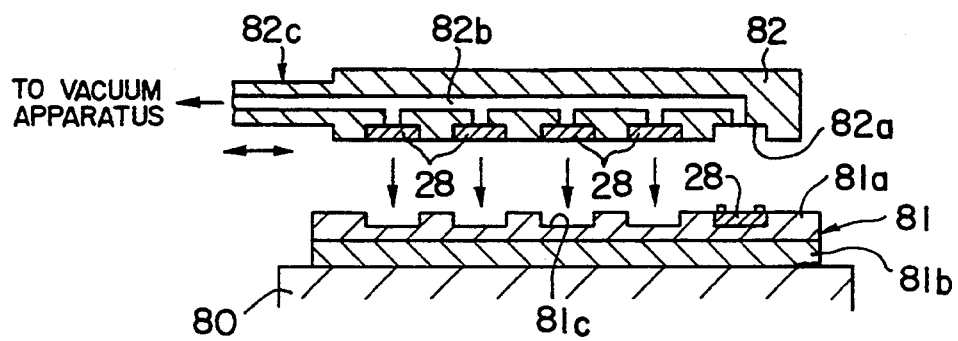
FIG. 8 is an outline longitudinal sectional view describing the method of using a chip card mounted facing downwards to carry in a cut chip to a measurement portion.
Figure 9:
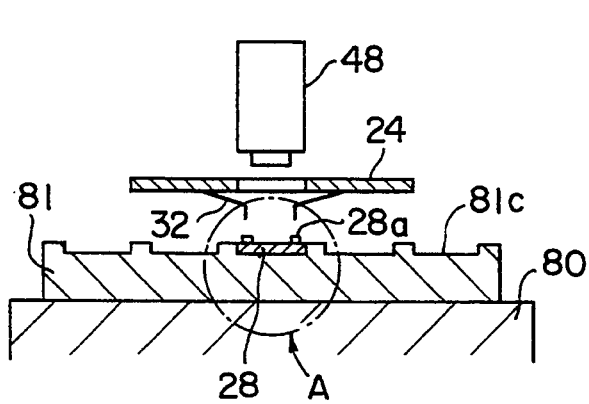
FIG. 9 is an outline longitudinal sectional view showing the arrangement of a CCD camera immediately above the center of a probe card arranged facing downwards, and the performance of chip testing.
Figure 10:
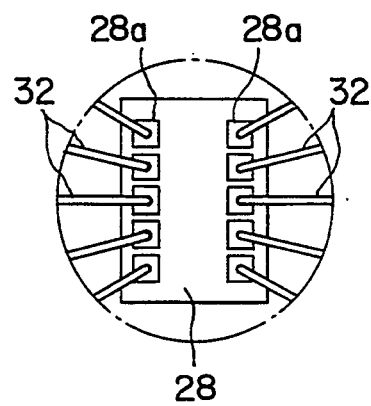
FIG. 10 is an enlarged plan view of one portion A of FIG. 9.

More specifically, as shown in FIG. 8, a chuck 81 is arranged above the stage 80 so as to allow movement and correction of the X-Y, Z and $\theta$ directions. The chuck 81 is separated into an upper portion 81a and a lower portion 81b. The upper portion 81a forms a housing groove 81c for housing the chips 28 which can be exchanged in accordance with the dimension of the chip 28. The conveyor manipulator 82 is arranged so as to carry chips in and out immediately above the chuck 81, and a conveyor arm 82c can carry chips to the and from testing place. The surface of the object for testing is made to face upwards by the suction force from the air holes 82b in the housing grooves 82a, and the chip 28 held by suction has its suction force cancelled and is allowed to fall as shown by the arrow, into the housing groove 82a of the chip 82. The chips 28 housed in the chuck 81 have their positions detected respectively by the CCD camera 48 arranged immediately above, and another means (such as a sensor for detecting the Z position); Pre-alignment is performed for each chip for the X-Y and Z directions, then the bonding pad of the chip 28 and the probe 32 of the probe card 24 are brought into contact (see FIG. 10), and the electrical characteristics of the chip 28 are measured.

Figure 11:
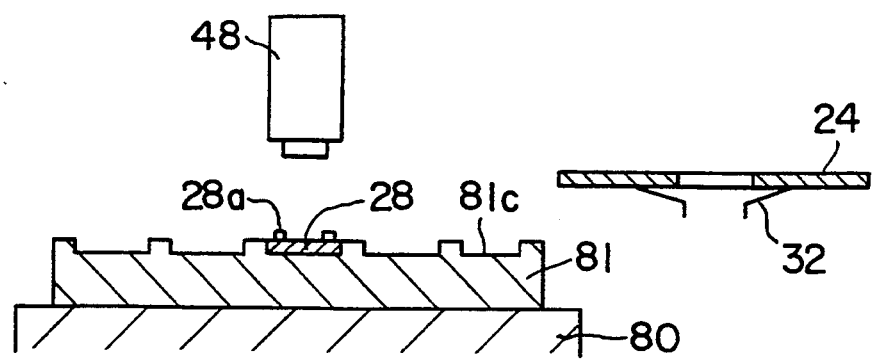
FIG. 11 is an outline longitudinal sectional view describing the another embodiment for the arrangement of a CCD camera away from the center of a probe card facing downwards, and for performing chip testing.

Also, as shown in FIG. 11, it is also possible to arrange the CCD camera 48 away from the center of the probe card 24 which is arranged so as to face downwards to perform pre-alignment of the chip 28 and measure the electrical characteristics of the chip 28. In this case, the positions of the probes 32 and the image of the CCD camera 48 are stored beforehand in a memory.

The testing of the chip status can eliminate the conventional marking process for marking whether a chip is faulty or not, and therefore simplify the process for the separation of good chips.

As has been described above, it is possible for the following effects to be exhibited by the present invention. More specifically, it is possible to have the efficient measurement of the electrical characteristics of a chip which has either been packaged or a chip of an integrated circuit which has been cut from a semiconductor wafer. Accordingly, it is possible to guarantee the quality at the chip level of unpackaged chips of integrated circuits which have been cut from a semiconductor wafer, and therefore correspond to the demand for higher mounting densities.

In addition, the probe apparatus of the present invention can also be used for the testing of MCM (Multi Chip Modules).

What is claimed is:

1. A method for mounting and testing a semiconductor device to be tested with a transport apparatus and a testing apparatus, the semiconductor device having a surface to be tested with at least one bonding pad, and an undersurface, the transport apparatus including a first case member, a second case member, a transporting means having a plurality of arms, at least one of the arms having a distal end with a suction means located therein, the testing apparatus having a probe means having at least one probe wire, said method comprising the steps of:

arranging a plurality of semiconductor devices to be tested on the first case member with their surfaces to be tested facing upwards;

moving at least one of the case members such that the second case member is located over the first case member and substantially in abutment therewith to cover the semiconductor devices to be tested;

overturning the first case member and the second case member, while maintaining abutment therebetween whereby the semiconductor devices to be tested become supported on the second case member with the undersurface facing upwards and the surface to be tested facing downwards;

moving at least on of the case members so as to expose the undersurface of the semiconductor devices to be tested;

moving the transporting means so as to position the distal end of one of the arms in contact with the undersurface of a semiconductor device to be tested and securing it to the distal end by the suction means;

moving the transporting means so as to position the secured semiconductor device to be tested over the probe means;

aligning the secured semiconductor device so as to place at least one bonding pad in contact with at least one probe wire;

measuring electrical characteristics of the secured semiconductor device with the testing apparatus.

2. The method for mounting and testing semiconductor devices as claimed in claim 1, wherein the transporting means further includes an image sensing means and wherein the step of aligning the secured semiconductor device further includes the steps of:

moving the distal ends of the arms to position the secured semiconductor devices's surface to be tested over the image sensing means for properly orienting the secured object to be tested.

3. The method for mounting and testing semiconductor devices as claimed in claim 1, wherein the transporting means further includes an image sensing means and wherein the method further includes:

adjusting the position of the arms according to sensing by the image sensing means for properly orienting the secured semiconductor device to be tested.

4. The method for mounting and testing semiconductor devices as claimed in claim 1, wherein the method further includes the step of:

using an electrostatic capacitance sensing means to adjust the position of the arms so as to properly orient the semiconductor device to be tested.

5. The method for mounting and testing semiconductor devices as claimed in claim 1, wherein the method further includes the steps of:

selectively separating semiconductor devices after testing based on results of the measurement of electrical characteristics thereof.

* * * * *